United States Patent
Meng et al.

(10) Patent No.: US 11,834,754 B2
(45) Date of Patent: Dec. 5, 2023

(54) ALD METHOD WITH MULTI-CHAMBERS FOR SIC OR MULTI-ELEMENTS EPITAXIAL GROWTH

(71) Applicant: SiEn (QingDao) Integrated Circuits Co., Ltd., Shandong (CN)

(72) Inventors: Zhaosheng Meng, Qingdao (CN); Zhuangzhuang Wu, Qingdao (CN); Min-Hwa Chi, Qingdao (CN)

(73) Assignee: SiEn (QingDao) Integrated Circuits Co., Ltd., Qingdao (CN)

(*) Notice: Subject to any disclaimer, the term of this patent is extended or adjusted under 35 U.S.C. 154(b) by 16 days.

(21) Appl. No.: 17/588,207

(22) Filed: Jan. 28, 2022

(65) Prior Publication Data
US 2022/0243359 A1    Aug. 4, 2022

(30) Foreign Application Priority Data
Feb. 1, 2021   (CN) .......................... 202110135454.X

(51) Int. Cl.
*C30B 25/14* (2006.01)
*H01L 21/02* (2006.01)
(Continued)

(52) U.S. Cl.
CPC ............ *C30B 25/14* (2013.01); *C23C 16/325* (2013.01); *C23C 16/45544* (2013.01);
(Continued)

(58) Field of Classification Search
CPC ......... C30B 29/36; C30B 25/10; C30B 25/12; C30B 25/14; C30B 33/02; C23C 16/325;
(Continued)

(56) References Cited

U.S. PATENT DOCUMENTS

| | | | |
|---|---|---|---|
| 6,383,949 B1* | 5/2002 | Kim ..................... | C23C 16/401 257/E21.243 |
| 2005/0084610 A1* | 4/2005 | Selitser ............. | C23C 16/45519 427/248.1 |
| 2014/0238302 A1* | 8/2014 | Kim ....................... | C23C 16/52 118/724 |

OTHER PUBLICATIONS

George, "Atomic Layer Deposition: An Overview", Chemical Reviews, 2010, vol. 110, No. 1, p. 111-131.
(Continued)

*Primary Examiner* — Robert M Kunemund
(74) *Attorney, Agent, or Firm* — Chen Yoshimura LLP

(57) ABSTRACT

The present invention relates to an ALD (Atomic layer deposition) apparatus and an ALD method. The ALD apparatus is provided with a reacting chamber and an annealing chamber, in which the reacting chamber is positioned with several heaters, a substrate to be deposited with an epitaxial layer may be transferred between different heaters, and each heater may independently moderate temperature. Different heaters correspond to different ALDs, and the number of the heaters may be varied to meet required a film to be deposited or composition of a crystal material. Because the heaters may be optimized to adapt to required temperature of different reactant gases, thickness of the epitaxial layer will meet expectation, and quality of the epitaxial layer will be promoted. Meanwhile, moderating the temperature independently may raise yield of production. Further, the ALD apparatus of the present invention introduces gas both horizontally and vertically to form a more even airflow field which benefits in forming a high-quality epitaxial layer.

17 Claims, 4 Drawing Sheets

(51) Int. Cl.
    *C23C 16/455* (2006.01)
    *C30B 29/36* (2006.01)
    *C30B 25/10* (2006.01)
    *C30B 25/12* (2006.01)
    *C30B 33/02* (2006.01)
    *C23C 16/32* (2006.01)

(52) U.S. Cl.
    CPC .............. *C30B 25/10* (2013.01); *C30B 25/12* (2013.01); *C30B 29/36* (2013.01); *C30B 33/02* (2013.01); *H01L 21/0262* (2013.01); *H01L 21/02529* (2013.01)

(58) Field of Classification Search
    CPC ........... C23C 16/45544; H01L 21/0262; H01L 21/02529
    See application file for complete search history.

(56) References Cited

OTHER PUBLICATIONS

Yong, "Molecular beam epitaxy", IEEE Potentials, Oct. 1989, vol. 8, p. 18-22.

Xiang, "Applications of Epitaxy Technologies in an Industry of Making an Integrated Circuit", Application of IC, 2006. (English Abstract is attached.).

Liu et al., "Epitaxiall Growth of Cubic and Hexagonal GaN Films on GaAs(001) Substrates by MBE", Acta Physica Sinca, Jun. 2000, vol. 49, No. 6, p. 1132-1135 (English Abstract is included.).

Dai et al., "Recent State and Progress in ALE Technique of GaAs", Semiconductor Information, Aug. 1993, vol. 30, No. 4, p. 10-16 (English Abstract is included.).

\* cited by examiner

025# ALD METHOD WITH MULTI-CHAMBERS FOR SIC OR MULTI-ELEMENTS EPITAXIAL GROWTH

FIELD OF THE INVENTION

The present invention relates to semiconductor devices and semiconductor apparatus, and specially relates to a new ALD (Atomic layer deposition) apparatus and a new ALD method.

BACKGROUND OF THE INVENTION

ALD (Atomic layer deposition) is a method of forming deposition film through alternately introducing gaseous precursor pulses into a reactor to generate chemical adhesion and reaction on a base. ALD may satisfy requirements of controlling atomic layers and holding a shape during deposition through the sequential and self-limiting surface reaction. ALD may benefits in controlling deposition thickness precisely, even to the extent of Angstrom (A) order or single layer of atoms, and excellent step coverage and conformal deposition through the self-limiting characteristic of ALD. The self-limiting characteristic and temperature of the surface reaction will cause unpredictable disappearance of the precursor flow rate, and so as to cause non-statistical deposition. As such, an ALD film may keep a smooth surface and a shape conformal to an original base, but is not necessary aligned with a crystal base.

Most ALD technologies are based on binary reaction sequence, in which two reaction reactions occur and a film of a binary compound is deposited. Temperature and pressure of a chamber may be optimized to optimize the surface reaction, and usually the temperature is set to be lower than melting temperature of a base material. Because only a limited number of surfaces exist, the reaction merely generates a limited quantity of deposition material on the surfaces. If each of the surface reactions is self-limiting surface reaction, the both reactions may be performed in an order to deposit a film controlled in atomic order.

In current technologies, an ALD apparatus usually contacts with two reacting gases at a high temperature through rotating a substrate; however, such solution causes defects. Especially, an epitaxial layer requiring higher quality will be impacted by the defects in a greater deal. Therefore, a better controlling device and controlling method to carry out an ALD method and an ALD apparatus for high-quality crystal epitaxy are required.

SUMMARY OF THE INVENTION

In light of aforesaid problems in the current ALD (Atomic layer deposition) technologies, the present invention provides an ALD apparatus and an ALD method. The ALD apparatus is positioned with a reacting chamber and an annealing chamber, in which the reacting chamber is positioned with a plurality of heaters, a substrate to be deposited with an epitaxial layer may be transferred between different heaters, and each heater may independently moderate temperature. Different heaters correspond to different ALDs, and the number of the heaters may be varied to meet required a film to be deposited or a number of elements composing a crystal material. For example, a binary compound crystal corresponds to two heaters, a ternary compound corresponds to three heaters, and so forth. The ALD apparatus of the present invention introduces gas both horizontally and vertically to form a more even airflow field which benefits in forming a high-quality epitaxial layer.

To carry out one of the aforesaid objects and/or other related objects, the present invention provides an ALD apparatus, comprising: a reacting chamber, in which a plurality of heaters controlled independently are positioned, the heaters being positioned at a bottom of the reacting chamber, and the heaters being used to bear and heat a substrate to be deposited a film; a transmitting device, positioned between the heaters to be used to transmit the substrate between the heaters; and a gas introducing device, connecting to the reacting chamber to be used to provide reacting gas to the reacting chamber.

Optionally, a number of the heaters may be the same as a number of elements composing the film to be deposited.

Optionally, an annealing chamber may be further comprised, wherein the transmitting device transmits the substrate between the reacting chamber and the annealing chamber.

Optionally, the gas introducing device may comprise: a horizontal intake, positioned at a top of the reacting chamber and in a middle positioned of the top of the reacting chamber, the horizontal intake comprising a plurality of intake pipes, an air outlet of the intake pipes being positioned in the reacting chamber, and the air outlet being perpendicular to an axis of the reacting chamber; and a vertical intake, positioned at the top of the reacting chamber, the vertical intake comprising a plurality of air inlets positioned at the top of the reacting chamber, the air inlets being parallel to the axis of the reacting chamber.

According to another aspect of the present invention, an ALD apparatus is provided. The ALD apparatus comprises: a reacting chamber, in which a bearing step is positioned, the bearing step being positioned at a bottom of the reacting chamber and used to bear a substrate to be deposited with a film; and a gas introducing device, connecting with the reacting chamber to be used to provide a reacting gas to the reacting chamber, the gas introducing device comprising: a horizontal intake, positioned at a top of the reacting chamber and in a middle positioned of the top of the reacting chamber, the horizontal intake comprising a plurality of intake pipes, an air outlet of the intake pipes being positioned in the reacting chamber and perpendicular to an axis of the reacting chamber; and a vertical intake, positioned at the top of the reacting chamber, the vertical intake comprising a plurality of air inlets positioned at the top of the reacting chamber, air inlets being parallel to the axis of the reacting chamber.

Optionally, a plurality of bearing steps may be positioned in the reacting chamber, each of the bearing steps may be a heater which is controlled independently, and the heaters may be used for bearing and heating the substrate to be deposited with the film.

Optionally, a number of the heaters may be the same as a number of elements composing the film to be deposited.

Optionally, a transmitting device positioned between the heaters to transmit the substrate between the heaters may be further comprised.

Optionally, an annealing chamber may be further comprised, wherein the transmitting device transmits the substrate between the reacting chamber and the annealing chamber.

According to another aspect of the invention, an ALD method is provided. The ALD method comprises steps of: placing a substrate to be deposited with a film on a first heater of a reacting chamber; moderating temperature of the first heater to heat the substrate; introducing a first reacting gas into the reacting chamber to form a first atomic layer on a surface of the substrate; placing the substrate on a second heater of the reacting chamber; moderating temperature of the second heater to heat the substrate; introducing a second reacting gas into the reacting chamber to form a second atomic layer on the surface of the substrate, a surface reaction occurring at the second atomic layer and the first atomic layer to form a crystal film; and repeating the former steps to form the crystal film with a required thickness.

Optionally, after the step of introducing a first reacting gas into the reacting chamber to form a first atomic layer on a surface of the substrate, the ALD method may further comprise steps of: placing the substrate on a n-th heater of the reacting chamber; moderating temperature of the n-th heater to heat the substrate; and introducing a n-th reacting gas into the reacting chamber to form a n-th atomic layer on the surface of the substrate, the surface reaction occurring at the first atomic layer, the second atomic layer and the n-th atomic layer to form the crystal film, in which n indicates a number of elements composing the crystal film.

Optionally, a step of introducing a doping gas, a protecting gas and/or a diluent gas in the reacting chamber may be further comprised.

Optionally, a step of placing the substrate formed with the crystal film in the annealing chamber to be annealed may be further comprised.

Optionally, the first reacting gas or the second reacting gas may be introduced into the reacting chamber along an axis of the reacting chamber; and the doping gas, the protecting gas and/or the diluent gas may be introduced into the reacting chamber in a direction perpendicular to the axis of the reacting chamber.

Optionally, the first reacting gas or the second reacting gas may be introduced into the reacting chamber in a direction perpendicular to an axis of the reacting chamber; and the doping gas, the protecting gas and/or the diluent gas may be introduced into the reacting chamber along the axis of the reacting chamber.

Yet, according to another aspect of the invention, an ALD method is provided. The ALD method may comprise steps of: placing a substrate to be deposited with a film on a bearing step of a reacting chamber; setting temperature of the reacting chamber to heat the substrate; introducing a first reacting gas into the reacting chamber along an axis of the reacting chamber, and introducing a doping gas, a protecting gas and/or a diluent gas in a direction perpendicular to the axis of the reacting chamber at the same time to form a first atomic layer on a surface of the substrate; moderating temperature of the reacting chamber to heat the substrate; introducing a second reacting gas into the reacting chamber along the axis of the reacting chamber, and introducing a doping gas, a protecting gas and/or a diluent gas in the direction perpendicular to the axis of the reacting chamber at the same time to form a second atomic layer on the surface of the substrate, a surface reaction occurring at the second atomic layer and the first atomic layer to form a crystal film; and repeating the former steps to form the crystal film with a required thickness.

Yet, according to another aspect of the invention, an ALD method is provided. The ALD method may comprise steps of: placing a substrate to be deposited with a film on a bearing step of a reacting chamber; setting temperature of the reacting chamber to heat the substrate; introducing a first reacting gas into the reacting chamber in a direction perpendicular to an axis of the reacting chamber, and introducing a doping gas, a protecting gas and/or a diluent gas into the reacting chamber along the axis of the reacting chamber to form a first atomic layer on a surface of the substrate; moderating temperature of the reacting chamber to heat the substrate; introducing a second reacting gas into the reacting chamber along the axis of the reacting chamber, and introducing the doping gas, the protecting gas and/or the diluent gas into the reacting chamber in the direction perpendicular to an axis of the reacting chamber at the same time to form a second atomic layer of the surface of the substrate, a surface reaction occurring at the second atomic layer and the first atomic layer to form a crystal film; and repeating the former steps to form the crystal film with a required thickness.

Yet, according to another aspect of the invention, an ALD method is provided. The ALD method may comprise steps of: placing a substrate to be deposited with a film on a bearing step of a reacting chamber; setting temperature of the reacting chamber to heat the substrate; introducing a first reacting gas into the reacting chamber along the axis of the reacting chamber, and introducing a doping gas, a protecting gas and/or a diluent gas into the reacting chamber in a direction perpendicular to an axis of the reacting chamber to form a first atomic layer on a surface of the substrate; moderating temperature of the reacting chamber to heat the substrate; introducing a second reacting gas into the reacting chamber in the direction perpendicular to an axis of the reacting chamber, and introducing the doping gas, the protecting gas and/or the diluent gas into the reacting chamber along the axis of the reacting chamber at the same time to form a second atomic layer of the surface of the substrate, a surface reaction occurring at the second atomic layer and the first atomic layer to form a crystal film; and repeating the former steps to form the crystal film with a required thickness.

Optionally, the plurality of bearing steps are positioned in the reacting chamber, and each of the bearing step is a heater controlled independently, before introducing the first reacting gas into the reacting chamber, placing the substrate on the first heater and moderating temperature of the first heater to heat the substrate; and before introducing the second reacting gas into the reacting chamber, placing the substrate on the second heater and moderating temperature of the first heater to heat the substrate.

Optionally, after introducing the second reacting gas into the reacting chamber to form the second atomic layer of the surface of the substrate, the ALD method further comprises steps of: placing the substrate on a n-th heater of the reacting chamber; moderating temperature of the n-th heater to heat the substrate; and introducing a n-th reacting gas into the reacting chamber to form a n-th atomic layer on the surface of the substrate, the surface reaction occurring at the first atomic layer, the second atomic layer and the n-th atomic layer to form the crystal film, in which n indicates a number of elements composing the crystal film.

As mentioned above, the ALD apparatus and method of the present invention at least bring technical effects as follows: the ALD apparatus is positioned with the reacting chamber and the annealing chamber, in which the reacting chamber is positioned with the heaters, the substrate to be deposited with an epitaxial layer may be transferred between different heaters, and each heater may independently moderate temperature. Different heaters correspond to different ALDs, and the number of the heaters may be varied to meet required a film to be deposited or a number of elements composing a crystal material. For example, a binary compound crystal corresponds to two heaters, a ternary compound corresponds to three heaters, and so forth. Because the heaters may be optimized to adapt to required temperature of different reactant gases, thickness of the epitaxial layer will meet expectation, and quality of the epitaxial layer will be promoted. Meanwhile, moderating the temperature independently may raise yield of production.

Further, the ALD apparatus of the present invention introduces gas both horizontally and vertically to form a more even airflow field which benefits in forming a high-quality epitaxial layer.

The ALD method of the present invention may apply aforesaid ALD apparatus to moderate the temperature of different heaters for different reacting gases, and so as to carry out various atomic layer depositions and surface reactions to form the high-quality epitaxial layer with uniform quality and thickness.

BRIEF DESCRIPTION OF THE DRAWINGS

Various objects and advantages of the present invention will be more readily understood from the following detailed description when read in conjunction with the appended drawing as follows.

DESCRIPTION OF EMBODIMENTS OF THE INVENTION

Reference is now made to the following concrete examples taken in conjunction with the accompanying drawings to illustrate implementation of the present invention. Persons of ordinary skill in the art having the benefit of the present disclosure will understand other advantages and effects of the present invention. The present invention may be implemented with other examples. For various view or application, details in the present disclosure may be used for variation or change for implementing embodiments within the scope of the present invention.

Please note that the drawings provided here are only for examples but not limited to the specific number or scale shown therein. When implementing the examples according to the drawings, condition, number, shape, size, relative position and proportion of each element may be changed and arrangement of the elements may be in a more complex way.

First Embodiment

Traditional ALD (Atomic layer deposition) technologies usually introduce different reacting gases at two sides of a chamber to expose a substrate to different reacting gases in an order through rotating the substrate in the chamber, so as to form different atomic layers on the substrate to form a required film. Such ALD technologies fail to control the different reacting gases respectively, nor precisely control conditions in the chamber, such as temperature. Therefore, they cannot satisfy deposition of a high-quality film.

Figure 1:
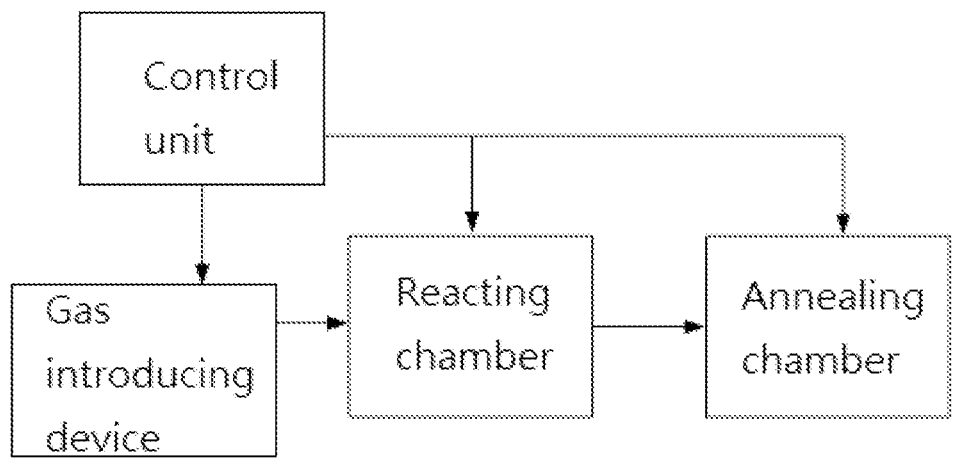
FIG. 1 shows a perspective view of a structure of an ALD (Atomic layer deposition) apparatus in a first embodiment according to the present invention.

In light of aforesaid defects, a present invention according to the present invention provides a ALD apparatus, as shown in FIG. 1. The ALD apparatus comprises a reacting chamber, a gas introducing device connecting to the reacting chamber, an annealing chamber, and a control unit connecting to the reacting chamber, the gas introducing device and the annealing chamber. The gas introducing device connecting to the reacting chamber is used to provide reacting gases to the reacting chamber to carry out ALD. The control unit connecting to the gas introducing device is used to select the reacting gases provided by the gas introducing device and control parameters such as gas flow rate of the reacting gases, gas supply period, etc. The control unit connecting to the reacting chamber is used to control a temperature in the reacting chamber, temperature holding period, etc. The control unit connecting to the annealing chamber is used to control a temperature of the annealing chamber and temperature holding period, etc.

In the present embodiment, a plurality of heaters are positioned at a bottom of the reacting chamber. The heaters are used to bear and heat a substrate to be deposited with a film. The heaters may control a heating period and a holding period independently. A number of the heaters in the reacting chamber may be varied to meet required number of elements composing the film to be deposited, for example the number of the heaters is the same as the number of elements composing the film to be deposited. As such, different heating temperatures may be set according to different characteristics of the reacting gas of each element, for example, different heating temperatures may be set according to different energies of chemical bonds of the reacting gases to carry out deposition of atomic layers.

Additionally, a transmitting device is positioned in the ALD apparatus of the present embodiment. The transmitting device may be set between the heaters to transmit a substrate between the heaters. Further, the transmitting device may transmit the substrate in the reacting chamber and the annealing chamber. The transmitting device may be a device which is capable to transmit the substrate, such as a robotic arm, electrostatic chuck, etc.

Figure 2:
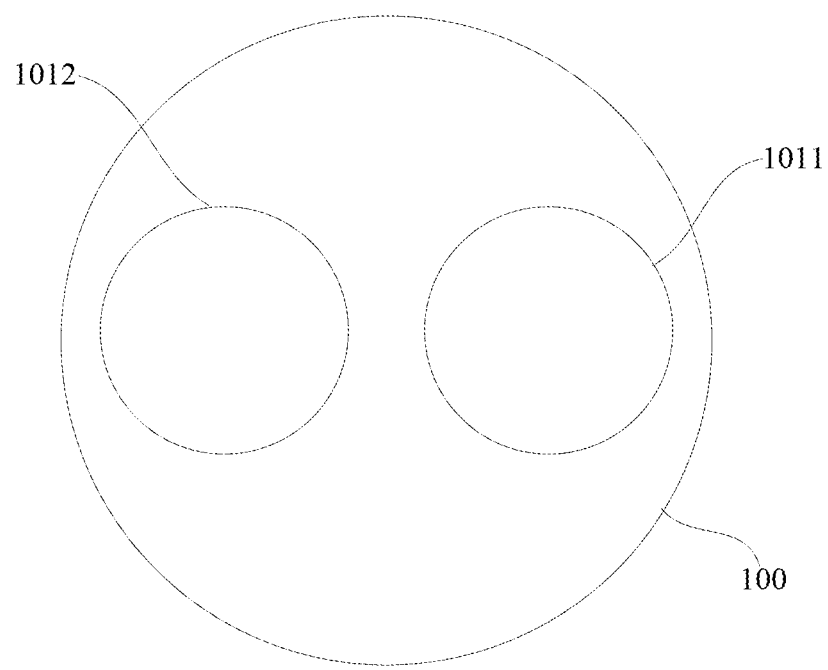
FIG. 2 shows a perspective view of a structure of heaters of a reacting chamber in the first embodiment according to the present invention.

Referring to FIG. 2, taking deposition of a binary compound crystal film for example, in the present embodiment, two heaters are positioned at a bottom of the reacting chamber 100, i.e. a first heater 1011 and a second heater 1012. Taking deposition of silicon carbide film for example, when performing silicon ALD, the substrate may be positioned on the first heater 1011, and a heating temperature of the first heater 1011 may be set. The temperature maybe set to meet different silicon source gas. For instance, when choosing TCS (Trichlorosilane) or silane as silicon source, a heating temperature of the first heater may be set to 800° C.~1000° C. After the substrate reaches the heating temperature, the silicon source gas is introduced into the reacting chamber. When the silicon source gas contacts with the substrate, a silicon atomic layer is formed on a surface of the substrate. A thickness of the silicon atomic layer may be less than 1 nm. Then, the introduction of the silicon source gas contacts in the reacting chamber may be stopped, the substrate may be placed on the second heater 1012 through the transmitting device, and a heating temperature of the second heater may be set. For example, when taking $C_3H_8$ as the carbon source gas, the heating temperature of the second heater may be set to 1000° C.~2000° C. After the substrate is heated to 1000° C.~2000° C., a carbon source gas (such as $C_3H_8$ or $C_2H_4$) is introduced into the reacting chamber. When the carbon source gas contacts with the substrate, a carbon atomic layer is formed on the surface of the substrate. A thickness of the carbon atomic layer may be less than 1 nm similarly. After forming the silicon atomic layer and the carbon atomic layer, annealing is performed through the transmitting device placing the substrate into the annealing chamber from the reacting chamber to form a high-quality SiC crystal layer, and a temperature of the annealing chamber is set to between 1200° C.~1400° C. Then, aforesaid steps are repeated until forming the SiC film with an expected thickness.

It is readily to be understood that before introducing the silicon source, after introducing the silicon source and before introducing the carbon source, and after introducing the carbon source, a cleaning gas may be introduced into the reacting chamber to clean the reacting chamber. Further, it is readily to be understood that an inert protecting gas (He, Ar, etc.) and/or a doping gas (a N type doping gas $N_2$) and/or a diluent gas (such as $H_2$), etc. may be introduced into the reacting chamber when introducing the silicon source gas and/or the carbon source gas, depending on requirements.

Figure 3:
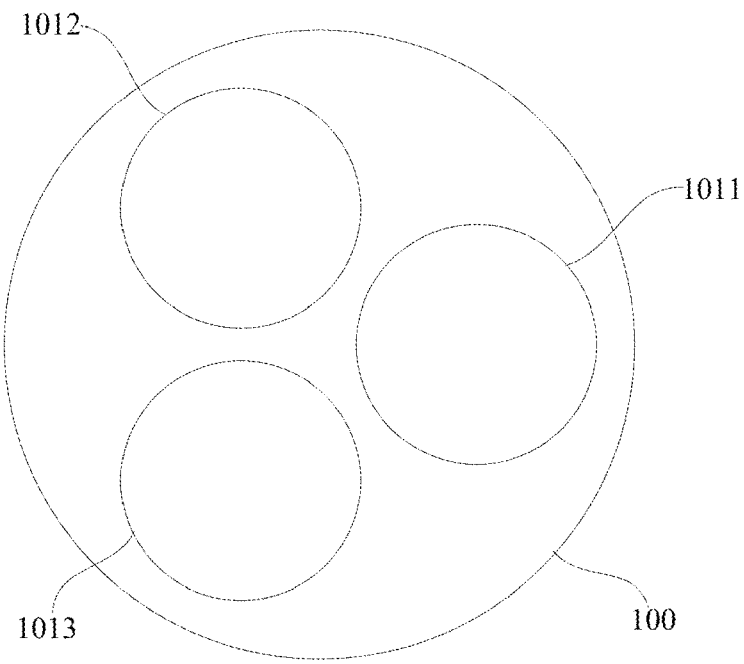
FIG. 3 shows a perspective view of another structure of the heaters of the reacting chamber in the first embodiment according to the present invention.

Referring to FIG. 3, taking deposition of a ternary compound the crystal film for example, in the present embodiment, three heaters are positioned at the bottom of the reacting chamber 100, i.e. a first heater 1011, a second heater 1012 and a third heater 1013. When depositing a first atomic layer, a substrate is positioned on the first heater 1011, a heating temperature of the first heater 1011 is set. The temperature may be set according to a chosen first gas source or a first atomic layer. After the substrate reaches the heating temperature of the first heater, the first gas source is introduced into the reacting chamber. When the first gas source contacts with the substrate, the first atomic layer is formed on a surface of the substrate. A thickness of the first atomic layer may be less than 1 nm. Then, the introduction of the first gas source to the reacting chamber may be stopped. The substrate then may be placed on the second heater 1012 through the transmitting device. A heating temperature of the second heater may be set. After the substrate reaches the heating temperature of the second heater, the second gas source is introduced into the reacting chamber. When the second gas source contacts with the substrate, a second atomic layer is formed on the surface of the substrate. A thickness of the second atomic layer may be less than 1 nm similarly. Then, the introduction of the second gas source to the reacting chamber may be stopped. The substrate then may be placed on the third heater 1013 through the transmitting device. A heating temperature of the third heater may be set. After the substrate reaches heating temperature of the third heater, a third gas source is introduced into the reacting chamber. When the third gas source contacts with the substrate, a third atomic layer is formed on the surface of the substrate. A thickness of the third atomic layer may be less than 1 nm similarly.

After forming the first atomic layer, the second atomic layer and the third atomic layer, through the transmitting device the substrate may be placed in the annealing chamber from the reacting chamber to be annealed to form high-quality ternary compound crystal layer. Then, aforesaid steps are repeated until forming a ternary compound the crystal film with an expected thickness.

Figure 4:
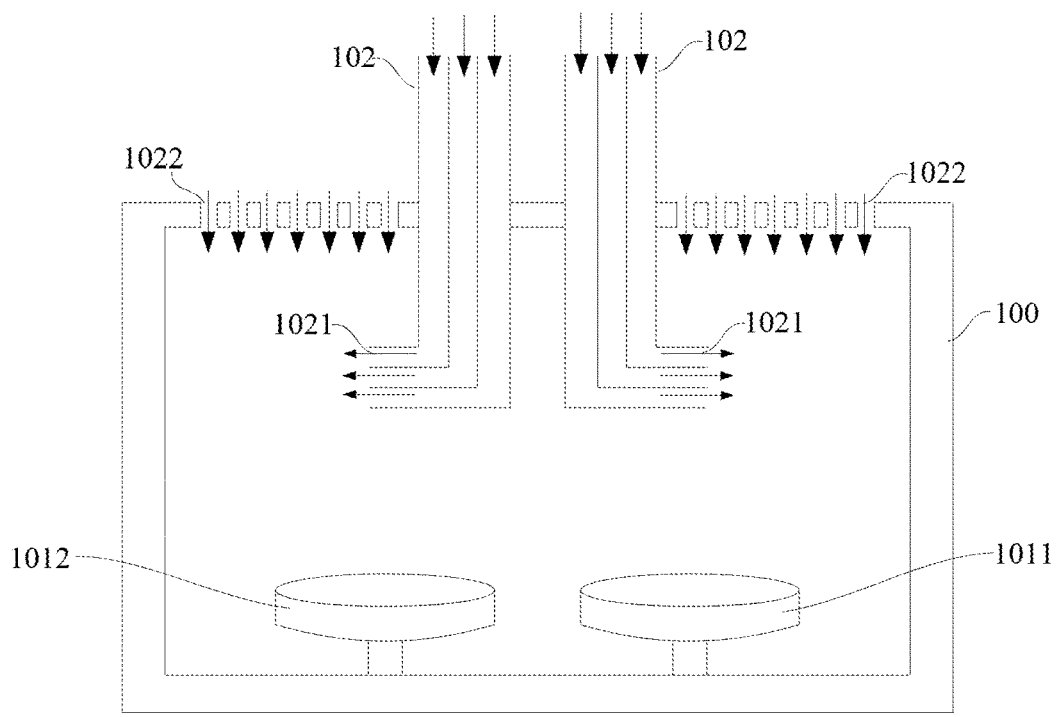
FIG. 4 shows a perspective view of a structure of air inlet of a gas introducing device in the reacting chamber in the first embodiment according to the present invention.

In another structure of the present embodiment, the gas introducing device is positioned with a horizontal intake and a vertical intake. Referring to FIG. 4, the horizontal intake comprises a plurality of intake pipes 102. The intake pipes 102 are positioned at a middle position of a top of the reacting chamber, and air outlets 1021 of the intake pipes are lower than the top of the reacting chamber inside the reacting chamber. The air outlets 1021 of the intake pipes 102 are all perpendicular to an axis of the reacting chamber, i.e. gases are flowed into the reacting chamber along an axis of the air outlets 1021 of the intake pipes 102 perpendicular to the reacting chamber.

The vertical intake is namely positioned at the top of the reacting chamber. In a preferred embodiment, the vertical intake may be a plurality of air inlets 1022 or intake pipes positioned at the top of the reacting chamber. Gases are flowed into the reacting chamber from the air inlets of the vertical intake along the axis of the reacting chamber.

When performing ALD, gases are flowed from both the vertical intake and the horizontal intake at the same time to inside of the reacting chamber. Taking forming a SiC film for example, when depositing a silicon atomic layer, a silicon source gas (such as TCS) is introduced from the vertical intake, and a doping gas and/or diluent gas is introduced from the horizontal intake, so as to form a uniform airflow field to allow the silicon source gas uniformly contacting with the substrate to form a uniform silicon atomic layer on the substrate. When performing carbon ALD after depositing the silicon atomic layer, a carbon source gas (such as $C_3H_8$) is introduced from the horizontal intake, and a doping gas and/or diluent gas is introduced form the vertical intake. As such, a uniform airflow field may be generated to allow the carbon source gas uniformly contacting with the substrate to form a uniform carbon atomic layer on the substrate, so as to form a SiC film with uniform thickness and quality. Here only an example of SiC film is illustrated for example, but when depositing other compound crystal film, similar way of introducing gases with horizontal and vertical directions may be applied to carry out a uniform airflow field to form highly uniform crystal film.

As mentioned above, the ALD apparatus of the present embodiment is positioned with the reacting chamber and the annealing chamber, in which the reacting chamber is positioned with several heaters, a substrate to be deposited with an epitaxial layer may be transferred between different heaters through the transmitting device, and each heater may independently moderate its heating temperature. Different heaters correspond to different ALDs, and the number of the heaters may be varied to meet required a film to be deposited or composition of a crystal material. For example, a binary compound crystal corresponds to two heaters, a ternary compound crystal corresponds to three heaters, and so on. Because the heaters may be optimized to adapt to required temperature of different reactant gases, thickness of the epitaxial layer will meet expectation, and quality of the epitaxial layer will be promoted. Meanwhile, moderating the temperature independently may raise yield of production.

Further, the ALD apparatus of the present invention introduces gas both horizontally and vertically to form an even airflow field which benefits in forming a high-quality epitaxial layer and raising the quality of the epitaxial layer.

Second Embodiment

A second embodiment provides an ALD apparatus. Referring to FIG. 1, the ALD apparatus comprises the reacting chamber, the gas introducing device connecting to the reacting chamber, the annealing chamber, and the control unit connecting to the reacting chamber, the gas introducing device and the annealing chamber. A bearing step is positioned at a bottom of the reacting chamber to bear the substrate to be deposited with the film. The gas introducing device connecting to the reacting chamber is used to provide reacting gases to the reacting chamber to carry out ALD. The control unit connecting to the gas introducing device is used to select the reacting gases provided by the gas introducing device and control parameters such as gas flow rate of the reacting gases, gas supply period, etc. The control unit connecting to the reacting chamber is used to control a temperature in the reacting chamber, temperature holding period, etc. The control unit connecting to the annealing chamber is used to control a temperature of the annealing chamber and temperature holding period, etc.

Figure 5:
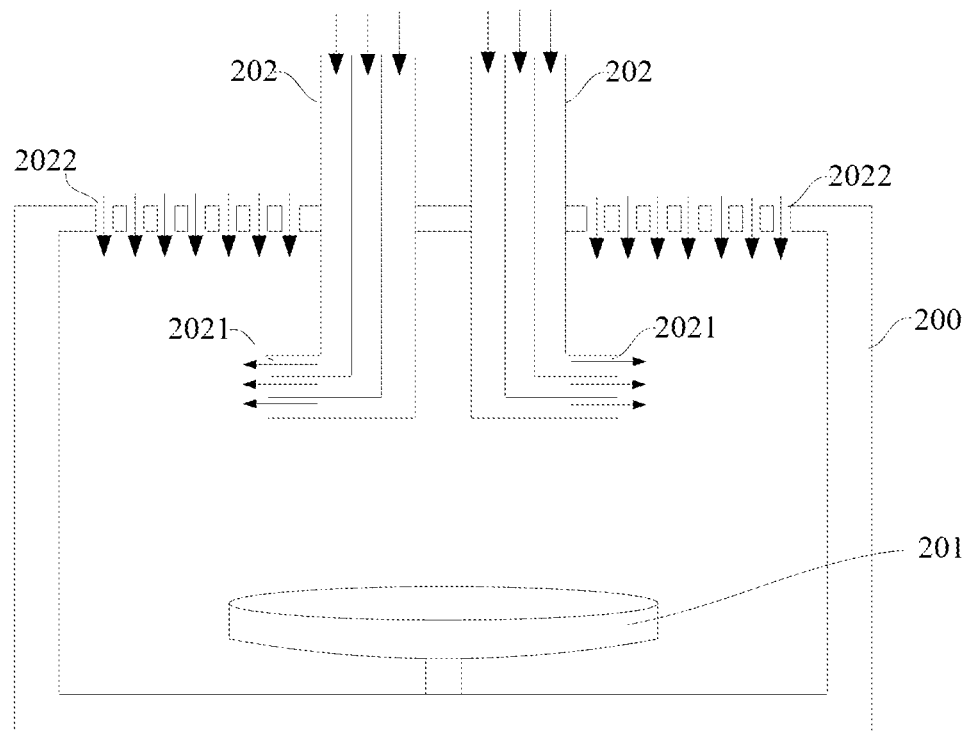
FIG. 5 shows a perspective view of a structure of a reacting chamber of an ALD apparatus in a second embodiment according to the present invention.

As shown in FIG. 5, in the present embodiment, the bearing step 201 is positioned at the bottom of the reacting chamber. The bearing step 201 is used to bear the substrate to be deposited with the film. A horizontal intake and a vertical intake are positioned at the gas introducing device. The horizontal intake comprises a plurality of intake pipes 202 which are positioned at a middle position of a top of the reacting chamber, and air outlets 2021 of the intake pipes are lower than the top of the reacting chamber inside the reacting chamber. The air outlets 2021 of the intake pipes 202 are all perpendicular to an axis of the reacting chamber, i.e. gases are flowed into the reacting chamber along an axis of the air outlets 2021 of the intake pipes 202 perpendicular to the reacting chamber.

The vertical intake is namely positioned at the top of the reacting chamber. In a preferred embodiment, the vertical intake may be a plurality of air inlets 2022 or intake pipes positioned at the top of the reacting chamber. Gases are flowed into the reacting chamber from the air inlets of the vertical intake along the axis of the reacting chamber.

When performing ALD, gases are flowed from both the vertical intake and the horizontal intake at the same time to inside of the reacting chamber. Taking forming a SiC film for example, when depositing a silicon atomic layer, a silicon source gas (such as TCS) is introduced from the vertical intake, and a doping gas and/or diluent gas is introduced from the horizontal intake, so as to form a uniform airflow field to allow the silicon source gas uniformly contacting with the substrate to form a uniform silicon atomic layer on the substrate. When performing carbon ALD after depositing the silicon atomic layer, a carbon source gas (such as $C_3H_8$) is introduced from the horizontal intake, and a doping gas and/or diluent gas is introduced form the vertical intake. As such, a uniform airflow field may be generated to allow the carbon source gas uniformly contacting with the substrate to form a uniform carbon atomic layer on the substrate, so as to form a SiC film with uniform thickness and quality. Here only an example of SiC film is illustrated for example, but when depositing other compound crystal film, similar way of introducing gases with horizontal and vertical directions may be applied to carry out a uniform airflow field to form highly uniform crystal film.

In the present embodiment, the bearing step 201 in the reacting chamber may be the plurality of independent heaters which are capable to control the heating temperature independently to heat the substrate with different temperatures. The arrangement of the heaters and temperature controlling may refer to the first embodiment, and they are not repeated here. Further, a transmitting device may be positioned between the heaters to transmit a substrate between the heaters. Further, the transmitting device may transmit the substrate between the reacting chamber and the annealing chamber at the same time.

The ALD apparatus of the present invention may introduce gas both horizontally and vertically to form an even airflow field which benefits in forming a high-quality epitaxial layer and raising the quality of the epitaxial layer.

Further, the bearing step may be the plurality of heaters, the substrate to be deposited with an epitaxial layer may be transmitted between the heaters through the transmitting device, and each heater may independently moderate its heating temperature. Different heaters correspond to different ALDs, and the number of the heaters may be varied to meet required a film to be deposited or composition of a crystal material. For example, a binary compound crystal corresponds to two heaters, a ternary compound crystal corresponds to three heaters, and so on. Because the heaters may be optimized to adapt to required temperature of different reactant gases, thickness of the epitaxial layer will meet expectation, and quality of the epitaxial layer will be promoted. Meanwhile, moderating the temperature independently may raise yield of production.

Third Embodiment

Figure 6:
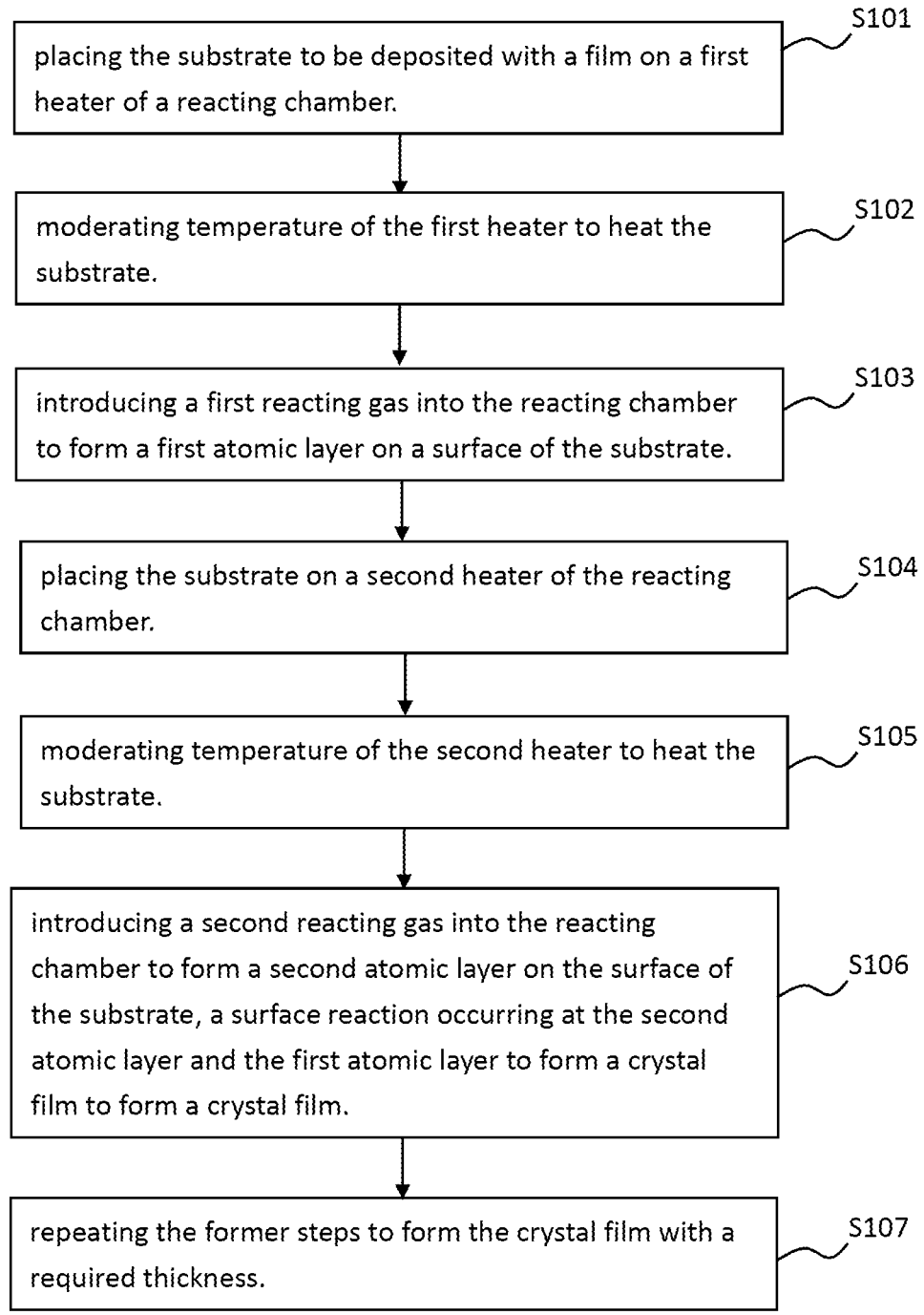
FIG. 6 shows a flow chart of an ALD method in a third embodiment according to the present invention.

A third embodiment provides an ALD method which may apply one of the ALD apparatus disclosed in the first and second embodiments. Taking depositing a binary compound crystal for example, preferably, when depositing the binary compound crystal, the ALD apparatus shown in FIG. 4 is used. As shown in FIG. 6, the method may comprise steps of: step S101: placing the substrate to be deposited with a film on a first heater of a reacting chamber; step S102: moderating temperature of the first heater to heat the substrate; step S103: introducing a first reacting gas into the reacting chamber to form a first atomic layer on a surface of the substrate; and step S104: placing the substrate on a second heater of the reacting chamber; step S105: moderating temperature of the second heater to heat the substrate; step S106: introducing a second reacting gas into the reacting chamber to form a second atomic layer on the surface of the substrate, a surface reaction occurring at the second atomic layer and the first atomic layer to form a crystal film to form a crystal film; step S107: repeating the former steps to form the crystal film with a required thickness.

Referring to FIG. 4, the substrate is placed on the heaters of the reacting chamber, and preferably, two substrates are placed on the first heater 1021 and the second heater 1022 respectively. At first, the reacting chamber is cleaned with such as a protecting gas He or Ar gas. Then, a heating temperature of the first heater may be set to heat the first heater. Taking depositing a SiC film for example, TCS gas or silane las may be chosen as the silicon source gas, and the heating temperature of the first heater may be set at 800° C.~1000° C. After the substrate reaches the heating temperature, the silicon source gas may be introduced into the reacting chamber. When the silicon source gas contacts with the substrate, a silicon atomic layer is formed on a surface of the substrate. A thickness of the silicon atomic layer may be less than 1 nm. Then, the introduction of the silicon source gas contacts in the reacting chamber may be stopped, the substrate may be placed on the second heater 1012 through the transmitting device, and a heating temperature of the second heater may be set. In the present embodiment, $C_3H_8$ is used as the carbon source gas. A heating temperature of the second heater may be set to 1000° C.~2000° C. After the substrate is heated to 1000° C.~2000° C., a carbon source gas (such as $C_3H_8$ or $C_2H_4$) is introduced into the reacting chamber. When the carbon source gas contacts with the substrate, a carbon atomic layer is formed on the surface of the substrate. A thickness of the carbon atomic layer may be less than 1 nm similarly. After forming the silicon atomic layer and the carbon atomic layer, annealing is performed through the transmitting device placing the substrate into the annealing chamber from the reacting chamber to form a high-quality SiC crystal layer, and a temperature of the annealing chamber is set to between 1200° C.~1400° C. Then, aforesaid steps are repeated until forming the SiC film with an expected thickness. As mentioned above, the method of the present embodiment applies different heaters to heat the substrate with different temperatures to adapt to different ALD, so as to form even atomic layers. As such, the method benefits in forming a compound crystal film with uniform thickness and quality.

When the substrate is transmitted to the second heater after finishing the Si ALD on the first heater, the substrate on the second heater may be transmitted to the first heater, so as to fully utilize the heaters in the reacting chamber to raise the yield.

In a preferred embodiment, when introducing the reacting gas into the reacting chamber, a protecting gas and/or doping gas and/or diluent gas may be introduced into the reacting chamber at the same time. Taking introducing the doping gas and the diluent gas for example, in the present embodiment, $N_2$ may be used as the doping gas, $H_2$ may be used as the diluent gas. Referring to FIG. 4, the silicon source gas (such as TCS) may be introduced through the vertical intake, and the doping gas $N_2$ and the diluent gas $H_2$ may be introduced through the horizontal intake, so as to form a uniform airflow field that allows the silicon source gas uniformly contacts with the substrate to form a uniform silicon atomic layer on the substrate. When performing carbon ALD after depositing the silicon atomic layer, the carbon source gas (such as $C_3H_8$) may be introduced through the horizontal intake, and the doping gas $N_2$ and the diluent gas $H_2$ may be introduced through the vertical intake. Such way to introduce gases may assist in carrying out a uniform airflow field to allow uniform contact between the carbon source gas and the substrate to form a carbon atomic layer with uniform thickness on the substrate, so as to form a SiC film with even thickness and quality. Here only an example of SiC film is illustrated for example, but when depositing other compound crystal film, similar way of introducing gases with horizontal and vertical directions may be applied to carry out a uniform airflow field to form highly uniform crystal film.

When performing deposition of compound crystal film having n (n≥3) elements, the substrate may be placed on n heaters of the reacting chamber, as mentioned above. After deposition of the second atomic layer on the second heater is finished, the substrate may be placed on a n-th heater of the reacting chamber; temperature of the n-th heater may be moderated to heat the substrate; a n-th reacting gas may be introduced into the reacting chamber to form a n-th atomic layer on a surface of the substrate, a surface reaction occurs between the first atomic layer, the second atomic layer and the n-th atomic layer to form a crystal film, in which n is a number of elements composing the crystal film.

When depositing the compound crystal film having n (n≥3) elements, a protecting gas and/or doping gas and/or diluent gas may be introduced into the reacting chamber. Preferably, the reacting gas and the protecting gas and/or the doping gas and/or the diluent gas may be introduced into reacting chamber in horizontal and vertical directions. The direction of each gas (horizontal or vertical direction) may be varied to meet actual requirements. Please note that aforesaid arrangements of introducing gases are only for example.

As mentioned above, the ALD apparatus and ALD method may bring these benefits: the ALD apparatus of the present invention is positioned with the reacting chamber and the annealing chamber, in which the reacting chamber is positioned with several heaters, the substrate to be deposited with an epitaxial layer may be transferred between different heaters through the transmitting device, and each heater may independently moderate its heating temperature. Different heaters correspond to different ALDs, and the number of the heaters may be varied to meet required a film to be deposited or composition of a crystal material. For example, a binary compound crystal corresponds to two heaters, a ternary compound crystal corresponds to three heaters, and so on. Because the heaters may be optimized to adapt to required temperature of different reactant gases, thickness of the epitaxial layer will meet expectation, and quality of the epitaxial layer will be promoted. Meanwhile, moderating the temperature independently may raise yield of production.

Further, the ALD apparatus of the present invention introduces gas both horizontally and vertically to form an even airflow field which benefits in forming a high-quality epitaxial layer and raising the quality of the epitaxial layer.

The ALD method of the present invention using one of aforesaid ALD apparatus moderates the temperature of different heaters according to different reacting gases to carry out different ALD and surface reaction, so as to form an epitaxial layer with uniform quality and thickness.

It is to be understood that these embodiments are not meant as limitations of the invention but merely exemplary descriptions of the invention. Indeed, different adaptations may be apparent to those skilled in the art without departing from the scope of the annexed claims.

What is claimed is:

1. An ALD (Atomic layer deposition) apparatus, comprising:
   a reacting chamber, in which a plurality of heaters controlled independently are positioned, the heaters being positioned at a bottom of the reacting chamber, and the heaters being used to bear and heat a substrate to be deposited a film;
   a transmitting device, positioned between the heaters to be used to transmit the substrate between the heaters; and
   a gas introducing device, connecting to the reacting chamber to be used to provide reacting gas to the reacting chamber, comprising:
      a horizontal intake, positioned at a top of the reacting chamber and in a middle positioned of the top of the reacting chamber, the horizontal intake comprising a plurality of intake pipes, an air outlet of the intake pipes being positioned in the reacting chamber, and the air outlet being perpendicular to an axis of the reacting chamber; and
      a vertical intake, positioned at the top of the reacting chamber, the vertical intake comprising a plurality of air inlets positioned at the top of the reacting chamber, the air inlets being parallel to the axis of the reacting chamber.

2. The ALD apparatus according to claim 1, wherein a number of the heaters is the same as a number of elements composing the film to be deposited.

3. The ALD apparatus according to claim 1, further comprising an annealing chamber, wherein the transmitting device transmits the substrate between the reacting chamber and the annealing chamber.

4. An ALD (Atomic layer deposition) apparatus, comprising:
- a reacting chamber, in which a bearing step is positioned, the bearing step being positioned at a bottom of the reacting chamber and used to bear a substrate to be deposited with a film; and
- a gas introducing device, connecting with the reacting chamber to be used to provide a reacting gas to the reacting chamber, the gas introducing device comprising:
    - a horizontal intake, positioned at a top of the reacting chamber and in a middle positioned of the top of the reacting chamber, the horizontal intake comprising a plurality of intake pipes, an air outlet of the intake pipes being positioned in the reacting chamber and perpendicular to an axis of the reacting chamber; and
    - a vertical intake, positioned at the top of the reacting chamber, the vertical intake comprising a plurality of air inlets positioned at the top of the reacting chamber, air inlets being parallel to the axis of the reacting chamber.

5. The ALD apparatus according to claim 4, wherein a plurality of bearing steps are positioned in the reacting chamber, each of the bearing steps is a heater which is controlled independently, and the heaters are used for bearing and heating the substrate to be deposited with the film.

6. The ALD apparatus according to claim 5, wherein a number of the heaters is the same as a number of elements composing the film to be deposited.

7. The ALD apparatus according to claim 5, further comprising a transmitting device positioned between the heaters to transmit the substrate between the heaters.

8. The ALD apparatus according to claim 7, further comprising an annealing chamber, wherein the transmitting device transmits the substrate between the reacting chamber and the annealing chamber.

9. An ALD (Atomic layer deposition) method, comprising steps of:
- placing a substrate to be deposited with a film on a first heater of a reacting chamber;
- moderating temperature of the first heater to heat the substrate;
- introducing a first reacting gas into the reacting chamber to form a first atomic layer on a surface of the substrate;
- placing the substrate on a second heater of the reacting chamber;
- moderating temperature of the second heater to heat the substrate;
- introducing a second reacting gas into the reacting chamber to form a second atomic layer on the surface of the substrate, a surface reaction occurring at the second atomic layer and the first atomic layer to form a crystal film;
- introducing a doping gas, a protecting gas and/or a diluent gas in the reacting chamber; and
- repeating the former steps to form the crystal film with a required thickness,
- wherein the first reacting gas or the second reacting gas is introduced into the reacting chamber along an axis of the reacting chamber, and the doping gas, the protecting gas and/or the diluent gas is introduced into the reacting chamber in a direction perpendicular to the axis of the reacting chamber.

10. The ALD method according to claim 9, wherein after the step of introducing a first reacting gas into the reacting chamber to form a first atomic layer on a surface of the substrate, the ALD method further comprises steps of:
- placing the substrate on a n-th heater of the reacting chamber;
- moderating temperature of the n-th heater to heat the substrate; and
- introducing a n-th reacting gas into the reacting chamber to forma n-th atomic layer on the surface of the substrate, the surface reaction occurring at the first atomic layer, the second atomic layer and the n-th atomic layer to form the crystal film, in which n indicates a number of elements composing the crystal film.

11. The ALD method according to claim 9, further comprising a step of: placing the substrate formed with the crystal film in the annealing chamber to be annealed.

12. The ALD method according to claim 9, wherein:
- the first reacting gas or the second reacting gas is introduced into the reacting chamber in a direction perpendicular to an axis of the reacting chamber; and
- the doping gas, the protecting gas and/or the diluent gas is introduced into the reacting chamber along the axis of the reacting chamber.

13. An ALD (Atomic layer deposition) method, comprising steps of:
- placing a substrate to be deposited with a film on a bearing step of a reacting chamber;
- setting temperature of the reacting chamber to heat the substrate;
- introducing a first reacting gas into the reacting chamber along an axis of the reacting chamber, and introducing a doping gas, a protecting gas and/or a diluent gas in a direction perpendicular to the axis of the reacting chamber at the same time to form a first atomic layer on a surface of the substrate;
- moderating temperature of the reacting chamber to heat the substrate;
- introducing a second reacting gas into the reacting chamber along the axis of the reacting chamber, and introducing a doping gas, a protecting gas and/or a diluent gas in the direction perpendicular to the axis of the reacting chamber at the same time to form a second atomic layer on the surface of the substrate, a surface reaction occurring at the second atomic layer and the first atomic layer to form a crystal film; and
- repeating the former steps to form the crystal film with a required thickness.

14. An ALD (Atomic layer deposition) method, comprising steps of:
- placing a substrate to be deposited with a film on a bearing step of a reacting chamber;
- setting temperature of the reacting chamber to heat the substrate;
- introducing a first reacting gas into the reacting chamber in a direction perpendicular to an axis of the reacting chamber, and introducing a doping gas, a protecting gas and/or a diluent gas into the reacting chamber along the axis of the reacting chamber to form a first atomic layer on a surface of the substrate;
- moderating temperature of the reacting chamber to heat the substrate;
- introducing a second reacting gas into the reacting chamber along the axis of the reacting chamber, and introducing the doping gas, the protecting gas and/or the diluent gas into the reacting chamber in the direction perpendicular to an axis of the reacting chamber at the same time to form a second atomic layer of the surface of the substrate, a surface reaction occurring at the second atomic layer and the first atomic layer to form a crystal film; and repeating the former steps to form the crystal film with a required thickness.

15. An ALD (Atomic layer deposition) method, comprising steps of:

placing a substrate to be deposited with a film on a bearing step of a reacting chamber;

setting temperature of the reacting chamber to heat the substrate;

introducing a first reacting gas into the reacting chamber along the axis of the reacting chamber, and introducing a doping gas, a protecting gas and/or a diluent gas into the reacting chamber in a direction perpendicular to an axis of the reacting chamber to form a first atomic layer on a surface of the substrate;

moderating temperature of the reacting chamber to heat the substrate;

introducing a second reacting gas into the reacting chamber in the direction perpendicular to an axis of the reacting chamber, and introducing the doping gas, the protecting gas and/or the diluent gas into the reacting chamber along the axis of the reacting chamber at the same time to form a second atomic layer of the surface of the substrate, a surface reaction occurring at the second atomic layer and the first atomic layer to form a crystal film; and repeating the former steps to form the crystal film with a required thickness.

16. The ALD method according to claim 15, wherein the plurality of bearing steps are positioned in the reacting chamber, and each of the bearing step is a heater controlled independently, before introducing the first reacting gas into the reacting chamber, placing the substrate on the first heater and moderating temperature of the first heater to heat the substrate; and before introducing the second reacting gas into the reacting chamber, placing the substrate on the second heater and moderating temperature of the first heater to heat the substrate.

17. The ALD method according to claim 16, wherein after introducing the second reacting gas into the reacting chamber to form the second atomic layer of the surface of the substrate, the ALD method further comprises steps of:

placing the substrate on a n-th heater of the reacting chamber;

moderating temperature of the n-th heater to heat the substrate; and introducing a n-th reacting gas into the reacting chamber to form a n-th atomic layer on the surface of the substrate, the surface reaction occurring at the first atomic layer, the second atomic layer and the n-th atomic layer to form the crystal film, in which n indicates a number of elements composing the crystal film.

* * * * *